United States Patent
Hiyoshi et al.

(10) Patent No.: US 9,543,429 B2
(45) Date of Patent: Jan. 10, 2017

(54) SILICON CARBIDE SEMICONDUCTOR DEVICE

(71) Applicant: Sumitomo Electric Industries, Ltd., Osaka-shi (JP)

(72) Inventors: Toru Hiyoshi, Osaka (JP); Takeyoshi Masuda, Osaka (JP); Keiji Wada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 15/026,842

(22) PCT Filed: Aug. 11, 2014

(86) PCT No.: PCT/JP2014/071173
§ 371 (c)(1),
(2) Date: Apr. 1, 2016

(87) PCT Pub. No.: WO2015/049923
PCT Pub. Date: Apr. 9, 2015

(65) Prior Publication Data
US 2016/0300943 A1 Oct. 13, 2016

(30) Foreign Application Priority Data
Oct. 4, 2013 (JP) .................................. 2013-209434

(51) Int. Cl.
*H01L 29/15* (2006.01)
*H01L 29/78* (2006.01)
(Continued)

(52) U.S. Cl.
CPC ....... *H01L 29/7811* (2013.01); *H01L 29/0623* (2013.01); *H01L 29/1095* (2013.01); *H01L 29/1608* (2013.01); *H01L 29/402* (2013.01)

(58) Field of Classification Search
CPC .................... H01L 29/1608; H01L 29/66068
(Continued)

(56) References Cited

U.S. PATENT DOCUMENTS

| | | | |
|---|---|---|---|
| 5,169,793 A | 12/1992 | Okabe et al. | |
| 5,464,992 A | 11/1995 | Okabe et al. | |

(Continued)

FOREIGN PATENT DOCUMENTS

| | | |
|---|---|---|
| JP | H04-229661 A | 8/1992 |
| JP | H07-249765 A | 9/1995 |

(Continued)

OTHER PUBLICATIONS

International Search Report in PCT International Application No. PCT/JP2014/071173, mailed Oct. 21, 2014.

*Primary Examiner* — Jami M Valentine

(74) *Attorney, Agent, or Firm* — Venable LLP; Michael A. Sartori

(57) ABSTRACT

There is provided a silicon carbide semiconductor device allowing for increased switching speed with a simpler configuration. A silicon carbide semiconductor device includes: a gate electrode provided on a gate insulating film; and a gate pad. The gate electrode includes a first comb-tooth shaped electrode portion extending from outside of the gate pad toward a circumferential edge portion of the gate pad and overlapping with the gate pad at the circumferential edge portion of the gate pad when viewed in a plan view. A p+ region includes: a central portion overlapping with the gate pad when viewed in the plan view; and a peripheral portion extending from the central portion toward the outside of the gate pad, the peripheral portion being provided to face the first comb-tooth shaped electrode portion of the gate electrode with a space interposed therebetween.

5 Claims, 15 Drawing Sheets

(51) Int. Cl.
*H01L 29/16* (2006.01)
*H01L 29/06* (2006.01)
*H01L 29/10* (2006.01)
*H01L 29/40* (2006.01)

(58) Field of Classification Search
USPC .......................................... 257/77; 438/931
See application file for complete search history.

(56) References Cited

U.S. PATENT DOCUMENTS

| | | | |
|---|---|---|---|
| 5,723,882 | A | 3/1998 | Okabe et al. |
| 5,977,587 | A | 11/1999 | Kito |
| 6,150,254 | A | 11/2000 | Kito |
| 2009/0315037 | A1* | 12/2009 | Kikkawa ............ H01L 29/0649 |
| | | | 257/76 |
| 2011/0278599 | A1* | 11/2011 | Nakao ................ H01L 21/0465 |
| | | | 257/77 |
| 2012/0012945 | A1* | 1/2012 | Inoue ................ H01L 29/41725 |
| | | | 257/401 |
| 2012/0326207 | A1 | 12/2012 | Yoshimochi |
| 2013/0020587 | A1* | 1/2013 | Hino .................. H01L 29/1095 |
| | | | 257/77 |
| 2013/0075758 | A1 | 3/2013 | Masuda et al. |
| 2014/0073121 | A1 | 3/2014 | Masuda et al. |

FOREIGN PATENT DOCUMENTS

| | | |
|---|---|---|
| JP | H09-17863 A | 1/1997 |
| JP | H10-313115 A | 11/1998 |
| JP | 2000-114524 A | 4/2000 |
| JP | 2003-115590 A | 4/2003 |
| JP | 2013-033931 A | 2/2013 |
| JP | 2013-069954 A | 4/2013 |
| WO | WO-2010/098294 A1 | 9/2010 |
| WO | WO-2011/125274 A1 | 10/2011 |

* cited by examiner

SILICON CARBIDE SEMICONDUCTOR DEVICE

TECHNICAL FIELD

The present invention relates to a silicon carbide semiconductor device, particularly, a silicon carbide semiconductor device having a gate insulating film and a gate electrode.

BACKGROUND ART

Silicon carbide (SiC) is a semiconductor having a band gap larger than that of silicon (Si), which has been conventionally widely used as a material for semiconductor devices, and is a so-called wide band gap semiconductor. By adopting silicon carbide as a material for a semiconductor device, the semiconductor device can have a high breakdown voltage, reduced on resistance, and the like. Further, the semiconductor device thus adopting silicon carbide as its material has characteristics less deteriorated even under a high temperature environment than those of a semiconductor device adopting silicon as its material, advantageously.

For example, WO 2010/098294 (Patent Document 1) discloses a silicon carbide semiconductor device including a MOSFET (Metal Oxide Semiconductor Field Effect Transistor) cell. The silicon carbide semiconductor device includes: a silicon carbide semiconductor substrate; a drift layer provided on a main surface of the silicon carbide semiconductor substrate and having a first conductivity type; and a well layer provided to extend from an upper surface of the drift layer to inside of the drift layer, the well layer having a second conductivity type. The silicon carbide semiconductor device further includes a semiconductor layer having the second conductivity type. This semiconductor layer is formed on the upper surface of the well layer or an upper layer portion of the well layer.

CITATION LIST

Patent Document

PTD 1: WO 2010/098294

SUMMARY OF INVENTION

Technical Problem

According to WO 2010/098294, immediately after the MOSFET cell is switched from the ON state to the OFF state, displacement current flows into the p type well layer via parasitic capacitance existing between the n type drain layer and the p type well layer. This displacement current causes voltage drop between the drain and source of the MOSFET.

The voltage drop becomes large when the p type well layer has a low impurity concentration. Meanwhile, the gate electrode has a voltage close to 0 V during the OFF state of the MOSFET cell. Accordingly, a voltage difference between the p type well layer and the gate electrode becomes large. Therefore, large voltage is likely to be applied to the gate insulating film. As a result, the insulating property of the gate insulating film may be decreased.

According to WO 2010/098294, no gate oxide film is provided on the main surface of the silicon carbide semiconductor substrate at a region located just below a gate pad. However, in order to implement such a structure, a gate oxide film has to be formed on the entire main surface of the silicon carbide semiconductor substrate, and then a portion of the gate oxide film has to be removed. Thus, the number of manufacturing steps is increased.

The present invention has an object to provide a silicon carbide semiconductor device allowing for increased switching speed with a simpler configuration.

Solution to Problem

A silicon carbide semiconductor device according to an aspect of the present invention includes a silicon carbide layer having a first main surface and a second main surface opposite to the first main surface. The silicon carbide layer includes: a first region having n type conductivity, the first region defining the first main surface of the silicon carbide layer; a second region provided in the first region, the second region having p type conductivity; and a third region provided in the second region, the third region having the p type conductivity, the third region having an impurity concentration higher than an impurity concentration of the second region. The silicon carbide semiconductor device further includes: a gate insulating film provided on the second region of the silicon carbide layer; a gate electrode provided on the gate insulating film; an interlayer insulating film provided to cover the gate insulating film and the gate electrode, the interlayer insulating film being provided with a contact hole to expose the gate electrode; and a gate pad provided on the interlayer insulating film, the gate pad being electrically connected to the gate electrode through the contact hole. The gate electrode includes a comb-tooth shaped electrode portion extending from outside of the gate pad toward a circumferential edge portion of the gate pad and overlapping with the gate pad at the circumferential edge portion of the gate pad when viewed in a plan view. The third region includes: a central portion overlapping with the gate pad when viewed in the plan view; and a peripheral portion extending from the central portion toward the outside of the gate pad, the peripheral portion being provided to face the comb-tooth shaped electrode portion of the gate electrode with a space interposed therebetween.

Advantageous Effects of Invention

According to the present invention, there can be implemented a silicon carbide semiconductor device allowing for increased switching speed with a simpler configuration.

DESCRIPTION OF EMBODIMENTS

Figure 1:
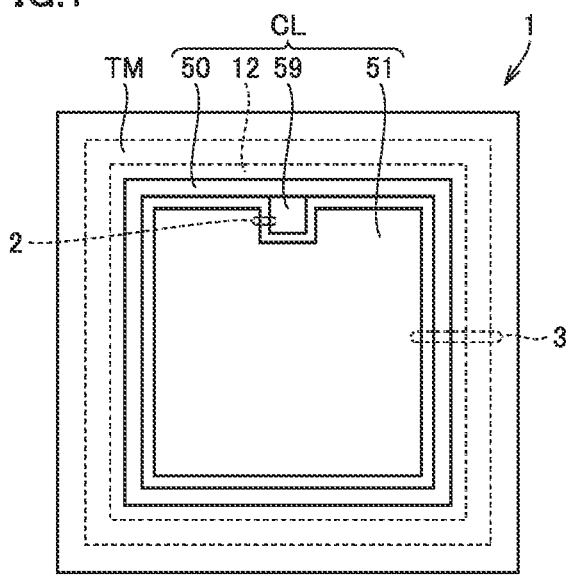
FIG. 1 is a plan view of a silicon carbide semiconductor device according to an embodiment of the present invention.

[Description of Embodiments of the Invention of the Present Application]

First, embodiments of the present invention are listed and described.

(1) A silicon carbide semiconductor device (1) according to an embodiment of the present invention includes a silicon carbide layer (10) having a first main surface (10a) and a second main surface (10b) opposite to the first main surface (10a). The silicon carbide layer includes: a first region (11) having n type conductivity, the first region (11) defining the first main surface (10a) of the silicon carbide layer (10); a second region (12) provided in the first region (11), the second region (12) having p type conductivity; and a third region (17a) provided in the second region (12), the third region (17a) having the p type conductivity and having an impurity concentration higher than an impurity concentration of the second region (12). The silicon carbide semiconductor device (1) further includes: a gate insulating film (21) provided on the second region (12) of the silicon carbide layer (10); a gate electrode (30) provided on the gate insulating film (21); an interlayer insulating film (29) provided to cover the gate insulating film (21) and the gate electrode (30), the interlayer insulating film (29) being provided with a first contact hole (33) to expose the gate electrode (30); and a gate pad (59) provided on the interlayer insulating film (29), the gate pad (59) being electrically connected to the gate electrode (30) through the first contact hole (33). The gate electrode (30) includes a first comb-tooth shaped electrode portion (36) extending from outside of the gate pad (59) toward a circumferential edge portion of the gate pad (59) and overlapping with the gate pad (59) at the circumferential edge portion of the gate pad (59) when viewed in a plan view. The third region (17a) includes: a central portion (25) overlapping with the gate pad (59) when viewed in the plan view; and a first peripheral portion (26) extending from the central portion (25) toward the outside of the gate pad (59), the first peripheral portion (26) being provided to face the first comb-tooth shaped electrode portion (36) of the gate electrode (30) with a space interposed therebetween.

According to this configuration, the p type region (third region) having the high impurity concentration is provided below the gate pad. In order to reduce the depletion layer expanding in the p type region, holes need to be injected into the depletion layer. The gate pad has a relatively large area. Accordingly, if the impurity concentration of the p type region (portion of the second region) below the gate pad is low, it takes a certain amount of time to reduce the depletion layer generated in the region. According to the above-mentioned configuration, the p type region having the high impurity concentration is provided below the gate pad. Accordingly, the depletion layer expanding in the second region (particularly, depletion layer expanding below the gate pad) can be quickly reduced. Therefore, the switching speed of the silicon carbide semiconductor device can be increased.

Furthermore, according to the above-mentioned configuration, the gate electrode and the third region do not overlap with each other when viewed in the plan view. The gate insulating film is provided on the second region. Therefore, the gate insulating film is also provided on the third region. If the gate insulating film and the gate electrode are provided on the p type region having the high impurity concentration, leakage current may be generated in the gate insulating film. By providing the gate electrode and the third region such that the gate electrode and the third region do not overlap with each other, the leakage current can be less likely to be generated while avoiding the structure from being complicated.

(2) Preferably, the silicon carbide semiconductor device (1) further includes a gate runner (50) provided to overlap with the second region (12) when viewed in the plan view, the gate runner (50) surrounding the gate electrode (30) and being electrically connected to the gate pad (59). The gate electrode (30) further includes a second comb-tooth shaped electrode portion (37) extending from a side inwardly of the gate runner (50) toward the gate runner (50) and overlapping with the gate runner (50) when viewed in the plan view. The interlayer insulating film (29) is provided with a second contact hole (33a) for electrically connecting the second comb-tooth shaped electrode portion (37) of the gate electrode (30) to the gate runner (50). The third region (17a) further includes a second peripheral portion (27) extending toward an inner circumferential side of the gate runner (50), the second peripheral portion (27) being provided to face the second comb-tooth shaped electrode portion (37) of the gate electrode (30) with a space interposed therebetween.

According to this configuration, the third region does not also overlap with the portion of the gate electrode connected to the gate runner. Therefore, the leakage current can be less likely to be generated while avoiding the structure from being complicated. Furthermore, by providing the third region not only below the gate pad but also below the gate runner, holes can be injected from a wider range into the depletion layer expanding in the second region. Accordingly, the depletion layer expanding in the second region can be reduced more quickly. Therefore, the switching speed of the silicon carbide semiconductor device can be increased.

(3) Preferably, the impurity concentration of the third region (17a) is not less than $5 \times 10^{18}$ cm$^{-3}$ and not more than $2 \times 10^{20}$ cm$^{+3}$.

According to this configuration, the p type region having a sufficiently high impurity concentration (sufficiently low electric resistance value) can be formed. Accordingly, more holes can be injected into the depletion layer.

(4) Preferably, the gate insulating film (21) is a thermal oxidation film.

According to this configuration, the gate insulating film can be formed in accordance with a more general manufacturing process. Furthermore, the leakage current can be less likely to be generated due to the gate insulating film below the gate pad. A structure having no gate insulating film below a gate pad tends to be complicated. Moreover, it requires a larger number of manufacturing steps. According to the above-mentioned configuration, a simple configuration can be realized. (5) Preferably, the silicon carbide semiconductor device (1) further includes: a fourth region (13) provided in the second region (12), the fourth region (13) having the n type conductivity; a fifth region (17) provided in the second region (12), the fifth region (17) having the p type conductivity; an ohmic electrode (31a) in ohmic junction with the third region (17a); and a source pad (51) electrically connected to the ohmic electrode (31a), the fourth region (13), and the fifth region (17).

According to this configuration, an electric resistance value between the third region and the source pad can be made sufficiently low.

[Details of Embodiments of the Invention of the Present Application]

The following describes embodiments of the present invention with reference to figures. It should be noted that in the below-mentioned figures, the same or corresponding portions are given the same reference characters and are not described repeatedly.

In this specification, the expression "when viewed in a plan view" is intended to indicate viewing a silicon carbide layer in a direction perpendicular to a main surface of the silicon carbide layer.

FIG. 1 is a plan view of a silicon carbide semiconductor device according to an embodiment of the present invention. With reference to FIG. 1, a silicon carbide semiconductor device 1 according to the embodiment of the present invention has an element region CL and a termination region TM. Element region CL includes a plurality of transistor elements. In this embodiment, each of the transistor elements is an element including a gate insulating film and a gate electrode, and is preferably a MOSFET. Termination region TM is provided to surround element region CL.

Element region CL has a gate pad 59, a gate runner 50, and a source pad 51. A body region 12 having p type conductivity is provided just below gate pad 59.

Gate runner 50 is provided outwardly of source pad 51 and is connected to gate pad 59. When viewed in a plan view, gate runner 50 is provided to overlap with body region 12. Source pad 51 is separated from both gate pad 59 and gate runner 50.

A region 2 is a region including the circumferential edge portion of gate pad 59. A region 3 is a region extending across gate runner 50 and termination region TM. Regarding silicon carbide semiconductor device 1 according to the present embodiment, the following representatively describes the configurations of portions represented by region 2 and region 3 in detail.

Figure 2:
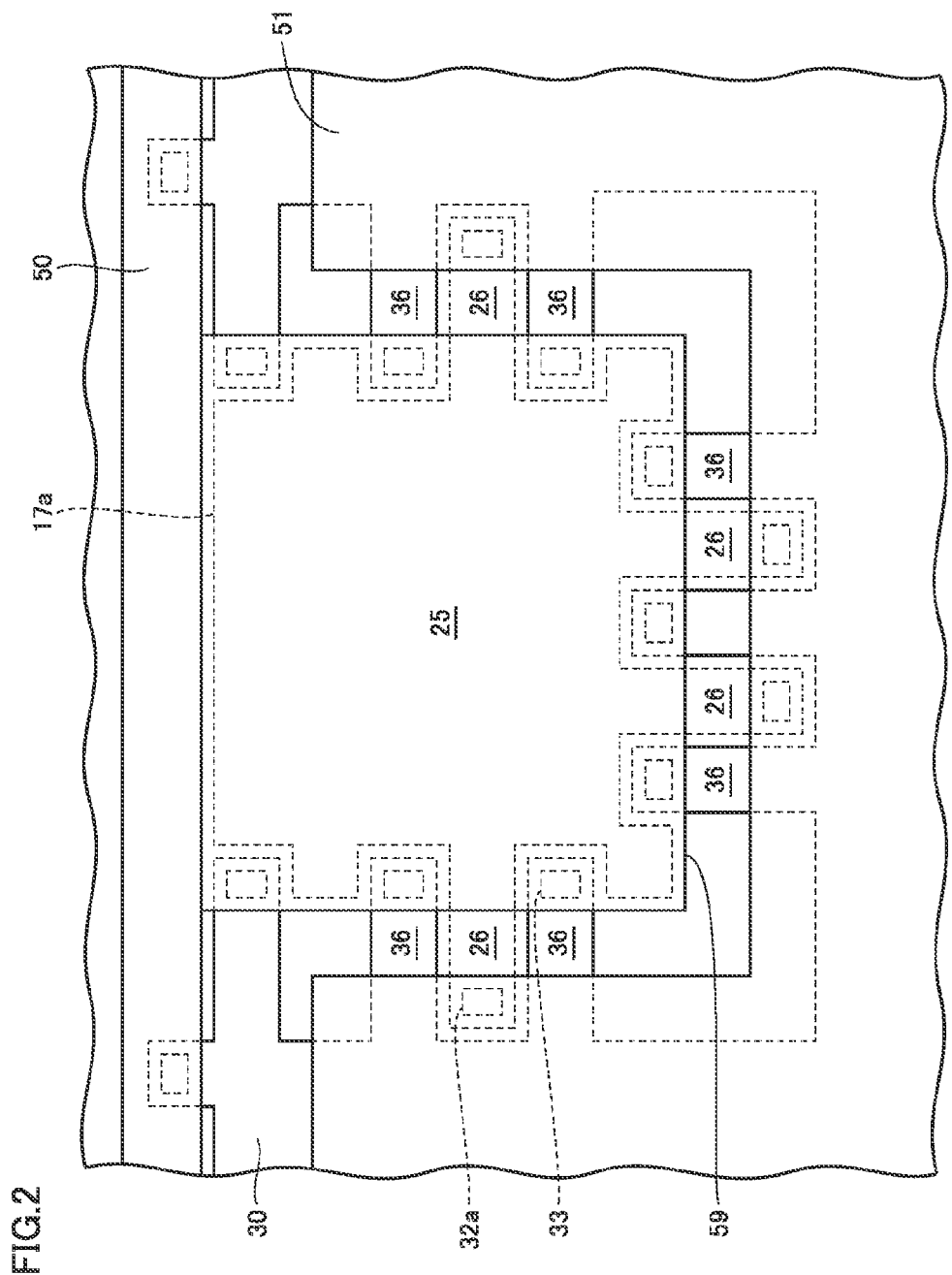
FIG. 2 is a plan view schematically showing a gate pad shown in FIG. 1 and a structure around the gate pad.

FIG. 2 is a plan view schematically showing gate pad 59 shown in FIG. 1 and a structure around gate pad 59. With reference to FIG. 2, a gate electrode 30 has comb-tooth shaped portions. The comb-tooth shaped portions are connected to gate pad 59 and gate runner 50.

Specifically, gate electrode 30 has a plurality of connection portions 36 connected to gate pad 59. The plurality of connection portions 36 extend from outside of gate pad 59 toward the circumferential edge portion of gate pad 59.

When viewed in a plan view, contact holes 33 are provided to overlap with the circumferential edge portion of gate pad 59 and connection portions 36 of gate electrode 30. Gate pad 59 is electrically connected to connection portions 36 of gate electrode 30 by contact holes 33.

Body region 12 is provided to extend across a whole of the range shown in FIG. 2. In particular, a $p^+$ region 17a is provided below gate pad 59. $P^+$ region 17a has a central portion 25 and a plurality of peripheral portions 26. Central portion 25 is located below the central portion of gate pad 59. In this embodiment, central portion 25 of $p^+$ region 17a is a continuous region having no gap therein.

The plurality of peripheral portions 26 extend from central portion 25 toward the outside of gate pad 59. The plurality of peripheral portions 26 are provided to face the comb-tooth shaped electrode portions (connection portions 36) of gate electrode 30 with a space interposed therebetween.

Figure 3:
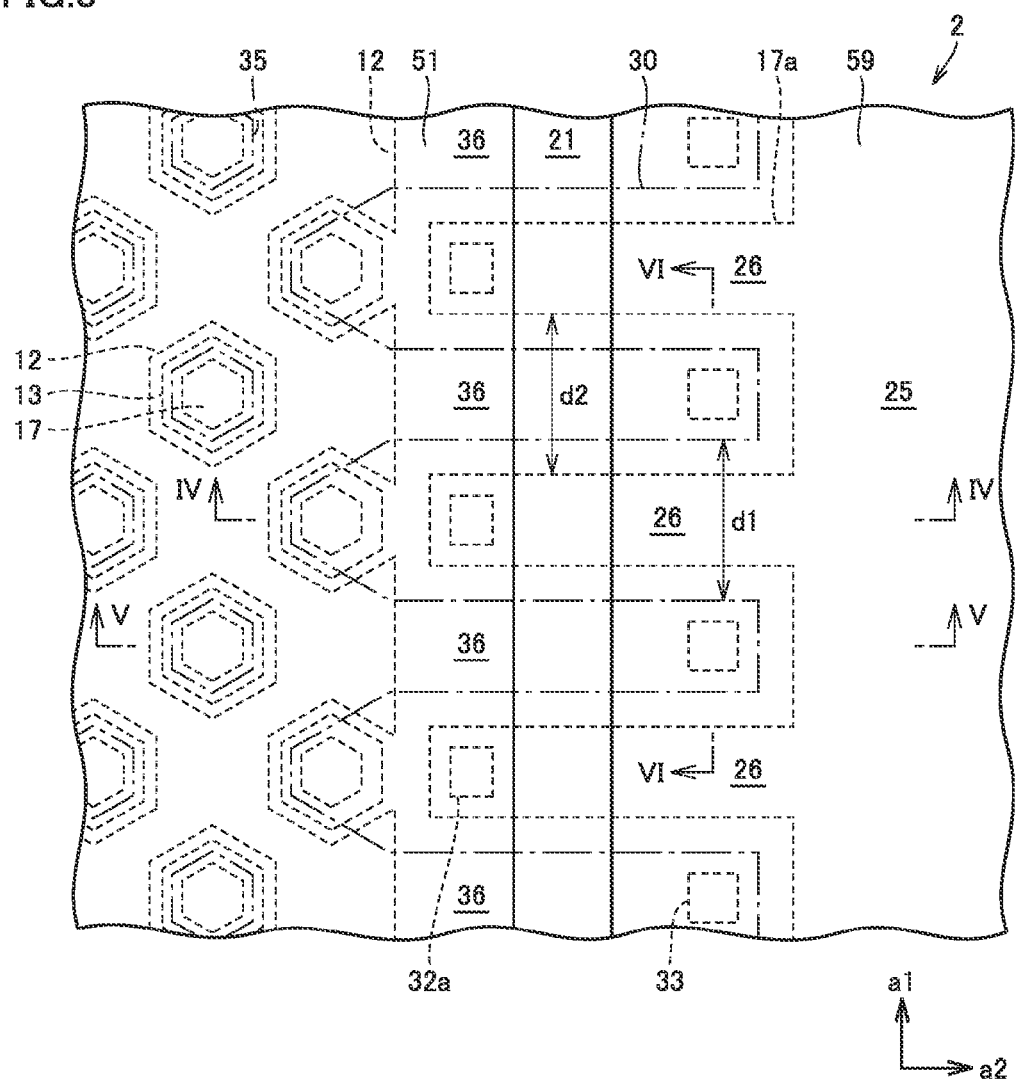
FIG. 3 is a partial enlarged view of a region 2 of silicon carbide semiconductor device 1 shown in FIG. 1.
Figure 4:
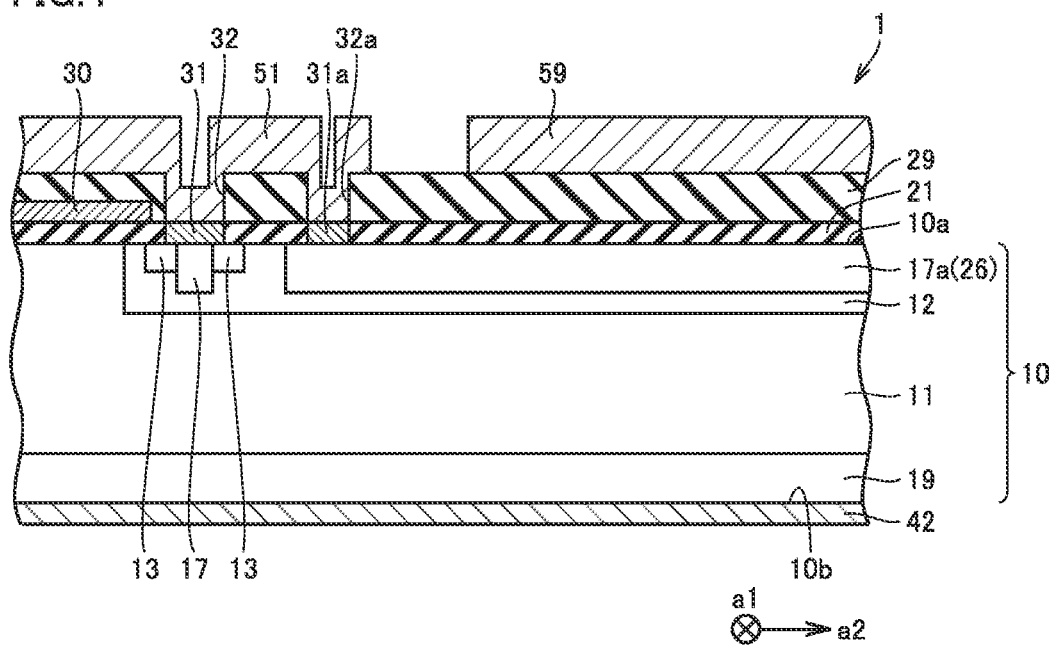
FIG. 4 is a partial cross sectional view of silicon carbide semiconductor device 1 along a IV-IV line of FIG. 3.
Figure 5:
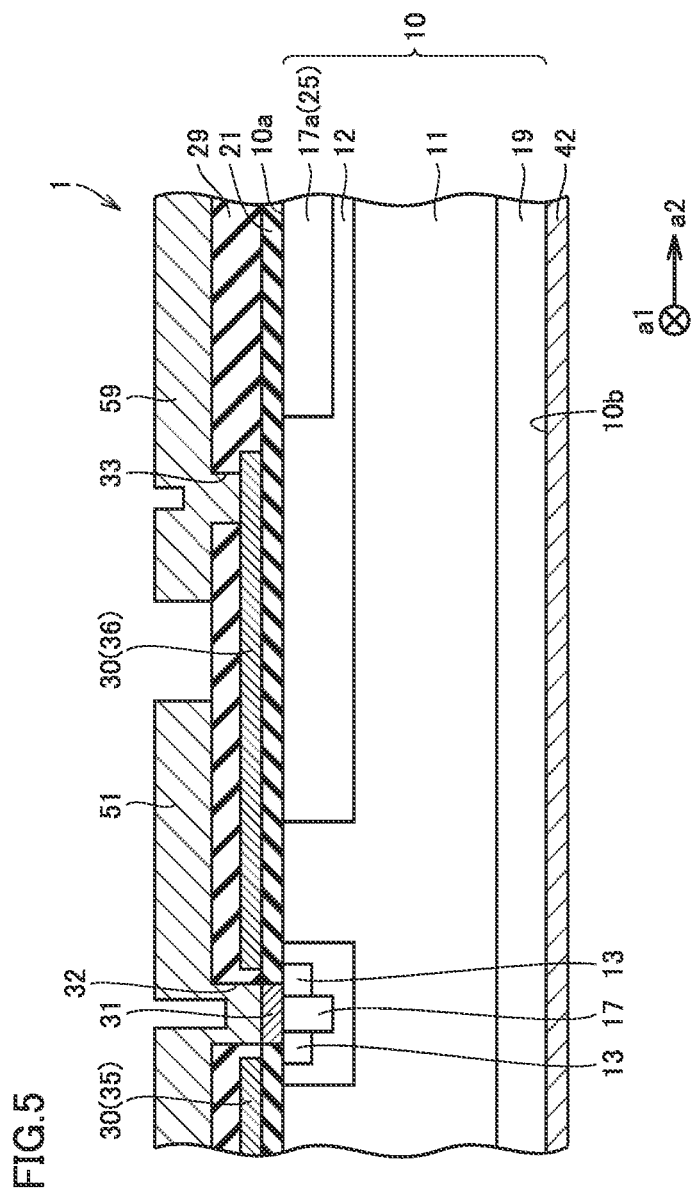
FIG. 5 is a partial cross sectional view of silicon carbide semiconductor device 1 along a V-V line of FIG. 3.
Figure 6:
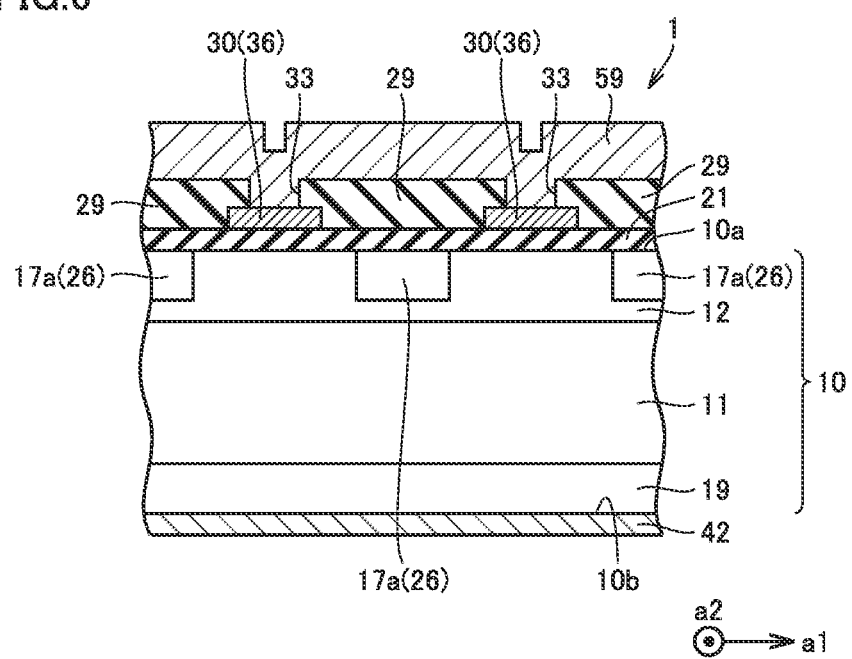
FIG. 6 is a partial cross sectional view of silicon carbide semiconductor device 1 along a VI-VI line of FIG. 3.

FIG. 3 is a partial enlarged view of region 2 of silicon carbide semiconductor device 1 shown in FIG. 1. FIG. 4 is a partial cross sectional view of silicon carbide semiconductor device 1 along a IV-IV line of FIG. 3. FIG. 5 is a partial cross sectional view of silicon carbide semiconductor device 1 along a V-V line of FIG. 3. FIG. 6 is a partial cross sectional view of silicon carbide semiconductor device 1 along a VI-VI line of FIG. 3.

With reference to FIG. 3 to FIG. 6, silicon carbide semiconductor device 1 includes a silicon carbide layer 10. Silicon carbide layer 10 has a first main surface 10a and a second main surface 10b. Silicon carbide layer 10 includes a single-crystal substrate 19, a drift region 11, body region 12, source regions 13, and $p^+$ regions 17, 17a.

Single-crystal substrate 19 has n type conductivity. Single-crystal substrate 19 is made of hexagonal silicon carbide of polytype 4H, for example. One surface of single-crystal substrate 19 defines second main surface 10b of silicon carbide layer 10.

Drift region 11 (first region) is provided on the other surface of single-crystal substrate 19 and has n type conductivity. Drift region 11 is a layer formed by epitaxial growth, for example. Drift region 11 is made of hexagonal silicon carbide of polytype 4H, for example. A surface of drift region 11 defines first main surface 10a of silicon carbide layer 10.

Body region 12 (second region) is provided on drift region 11. Body region 12 has p type conductivity different from n type conductivity.

Each of source regions 13 (fourth region) is provided in body region 12. Source region 13 has n type conductivity. Source region 13 has an impurity concentration higher than the impurity concentration of drift region 11. In one embodiment, the impurity concentration of drift region 11 is about $7.5 \times 10^{15}$ cm$^{-3}$, and the impurity concentration of source region 13 is about $1 \times 10^{20}$ cm$^{-3}$, for example.

$P^+$ regions 17, 17a are provided in body region 12, and have p type conductivity. $P^+$ region 17a (third region) is provided in body region 12 below gate pad 59. $P^+$ region 17 (fifth region) is provided in body region 12 constituting the transistor element (MOSFET).

The impurity concentration of each of $p^+$ regions 17, 17a is higher than the impurity concentration of body region 12. In one embodiment, the impurity concentration of body region 12 is about $1 \times 10^{18}$ cm$^{-3}$. The impurity concentration of $p^+$ region 17a is preferably not less than about $5 \times 10^{18}$ cm$^{-3}$ and not more than about $2 \times 10^{20}$ cm$^{-3}$. It should be noted that the impurity concentration of p$^+$ region 17 may fall in the same range as the range of the impurity concentration of p$^+$ region 17a or may fall in a different range from the range of the impurity concentration of p$^+$ region 17a.

If the impurity concentration of p$^+$ region 17a is less than $5 \times 10^{18}$ cm$^{-3}$, it becomes difficult to sufficiently reduce the electric resistance value of the p type region below gate pad 59. On the other hand, in view of solubility limit to silicon carbide, it is difficult to increase the concentration of the p type impurity to be not less than $2 \times 10^{20}$ cm$^{-3}$. When the impurity concentration of p$^+$ region 17a is not less than about $5 \times 10^{18}$ cm$^{-3}$ and not more than about $2 \times 10^{20}$ cm$^{-3}$, a p type region having a sufficiently high impurity concentration (a sufficiently low electric resistance value) can be formed below gate pad 59.

Silicon carbide semiconductor device 1 further includes a gate insulating film 21, an interlayer insulating film 29, gate electrode 30, ohmic electrodes 31, 31a, a source pad 51, and a gate pad 59.

Gate insulating film 21 is provided on first main surface 10a of silicon carbide layer 10 to cover first main surface 10a. In this embodiment, gate insulating film 21 is a thermal oxidation film, specifically, is made of silicon dioxide (SiO$_2$).

Gate electrode 30 is provided on gate insulating film 21. Gate electrode 30 extends from one source region 13 to the other source region 13 of two adjacent transistor cells. A channel region can be formed at a portion of body region 12 located below gate electrode 30 and between source region 13 and drift region 11. Current flowing through the channel region can be controlled by voltage applied to gate electrode 30.

Interlayer insulating film 29 is provided on gate insulating film 21 to cover gate electrode 30 and gate insulating film 21. A contact hole 32 (see FIG. 4) extends through interlayer insulating film 29 and gate insulating film 21 to expose source region 13 and p+ region 17. A contact hole 32a (see FIG. 4) extends through interlayer insulating film 29 and gate insulating film 21 to expose p$^+$ region 17a. A contact hole 33 (see FIG. 5 and FIG. 6) extends through interlayer insulating film 29 to expose gate electrode 30.

Ohmic electrode 31 is provided in contact hole 32 and is in ohmic junction with source region 13 and p$^+$ region 17. Ohmic electrode 31a is provided in contact hole 32a and is in ohmic junction with p$^+$ region 17a. For example, each of ohmic electrodes 31, 31a is made of a material having nickel and silicon. Each of ohmic electrodes 31, 31a may be made of a material having titanium, aluminum, and silicon. Ohmic electrode 31a can provide a decreased value of electric resistance between source pad 51 and p$^+$ region 17a.

Each of source pad 51 and gate pad 59 is an electrode made of a conductive material such as aluminum, for example. Source pad 51 is electrically connected to ohmic electrodes 31, 31a. With source pad 51, source region 13, p$^+$ region 17, and p$^+$ region 17a are electrically connected to one another. Gate pad 59 is electrically connected to gate electrode 30 through contact with gate electrode 30.

Drain electrode 42 is provided on second main surface 10b of silicon carbide layer 10. Drain electrode 42 is an ohmic electrode. Drain electrode 42 may be made of the same material as the material of each of ohmic electrodes 31, 31a or a material different from the material of each of ohmic electrodes 31, 31a.

As shown in FIG. 3, gate electrode 30 includes an element electrode portion 35 and the plurality of connection portions 36. Element electrode portion 35 is a portion providing a function as a gate electrode of each transistor element (MOSFET cell). The plurality of connection portions 36 are arranged side by side in a direction a1 with a predetermined space d1 interposed therebetween. Each of the plurality of connection portions 36 extends from element electrode portion 35 in a direction a2. In other words, the plurality of connection portions 36 are electrode portions (first comb-tooth shaped electrode portion) provided in the form of comb teeth. It should be noted that direction a2 is a direction extending from outside of gate pad 59 toward the circumferential edge portion of gate pad 59.

Directional and direction a2 are directions crossing each other. In one embodiment, direction a1 is a direction along any one of the sides of gate pad 59. Furthermore, direction a2 is a direction orthogonal to direction a1. However, direction a2 may obliquely cross direction a1.

P+ region 17a includes central portion 25 and the plurality of peripheral portions 26. When viewed in a plan view, the plurality of peripheral portions 26 are arranged side by side in direction a1 with predetermined space d2 interposed therebetween, and extends from central portion 25 in a direction opposite to direction a2. Therefore, peripheral portions 26 of p$^+$ region 17a are formed in the form of comb teeth. The direction opposite to direction a2 is a direction extending from inside gate pad 59 to outside of gate pad 59.

In direction a1, connection portions 36 of gate electrode 30 and peripheral portions 26 of p$^{30}$ region 17a are provided to face each other with a space interposed therebetween. In other words, peripheral portions 26 of p$^+$ region 17a are provided to mesh with the first comb-tooth shaped electrode portions of gate electrode 30.

P$^+$ region 17a is provided not to overlap with gate electrode 30. In this embodiment, connection portions 36 of gate electrode 30 and peripheral portions 26 of p$^+$ region 17a are arranged alternately along the side of gate pad 59. However, it is not limited such that connection portions 36 of gate electrode 30 and peripheral portions 26 of p$^{30}$ region 17a are arranged alternately. For example, one peripheral portion 26 may be provided for a plurality of connection portions 36. Alternatively, one connection portion 36 may be provided for a plurality of peripheral portions 26.

When viewed in a plan view, peripheral portions 26 of p$^+$ region 17a overlap with source pad 51. Contact holes 32a overlap with peripheral portions 26 of p$^+$ region 17a and source pad 51. Peripheral portions 26 of p$^{30}$ region 17a are electrically connected to source pad 51 at the circumferential edge portion of source pad 51.

The circumferential edge portion of source pad 51 refers to a portion of source pad 51 facing gate pad 59. A distance from the end (portion facing gate pad 59) of source pad 51 to each contact hole 32a can be the minimum distance permitted by the manufacturing process, for example.

According to this embodiment, a p type region having a high impurity concentration can be provided below gate pad 59. Accordingly, the switching speed of the MOSFET can be improved.

In the OFF state of the transistor element (MOSFET), reverse bias voltage is applied between n type drift region 11 and p type body region 12. Accordingly, a depletion layer expands from a contact surface between drift region 11 and body region 12 to the drift region 11 side and the body region 12 side. In order to improve the switching speed, it is preferable to reduce the depletion layer as quickly as possible.

In order to reduce the depletion layer expanding to the body region 12 side, holes need to be injected into the depletion layer. According to this embodiment, p$^+$ region 17a is provided in body region 12 below gate pad 59. $P^+$ region 17a has peripheral portions 26 electrically connected to source pad 51.

The impurity concentration of $p^+$ region 17a is higher than the impurity concentration of body region 12. With $p^+$ region 17a, more holes can be injected into the depletion layer expanding in body region 12 below gate pad 59. Therefore, the depletion layer expanding in body region 12 below gate pad 59 can be reduced more quickly. Accordingly, the switching speed of the MOSFET can be improved.

Meanwhile, immediately after the MOSFET is switched from the ON state to the OFF state, the drain voltage of the MOSFET is increased. In this case, displacement current flows into body region 12 via parasitic capacitance (junction capacitance) existing between drift region 11 and body region 12. The displacement current flows through body region 12 and flows into source pad 51. The electric resistance of body region 12 causes voltage drop in body region 12.

When the displacement current flows into body region 12 below gate pad 59, the displacement current is highly likely to flow into source pad 51 around gate pad 59. The impurity concentration of body region 12 is low and the displacement current flows in a long path. This is likely to result in a high electric resistance value of the path in which the displacement current flows. Therefore, large voltage drop is likely to take place in body region 12.

When the voltage drop is large in body region 12, a high electric field is likely to be applied between gate electrode 30 and body region 12 facing gate electrode 30. The application of the high electric field to gate insulating film 21 may result in deterioration of gate insulating film 21.

According to this embodiment, $p^{30}$ region 17a below gate pad 59 can provide a decreased electric resistance value in body region 12. Hence, when the displacement current flows into body region 12 below gate pad 59, the voltage drop in body region 12 can be small. This leads to a small electric field applied between gate electrode 30 and body region 12 facing gate electrode 30. Therefore, gate insulating film 21 can be protected.

Furthermore, according to this embodiment, $p^+$ region 17a (peripheral portions 26) is electrically connected to source pad 51 at the circumferential edge portion of source pad 51. Accordingly, $p^+$ region 17a is connected to source pad 51 via ohmic electrode 31a at a location as close to gate pad 59 as possible.

When holes are injected into the depletion layer expanding to the body region 12 side, the holes can be injected into body region 12 from a position close to gate pad 59 relative to the MOSFET cell. Accordingly, the depletion layer can be reduced more quickly. This leads to improved switching speed of the MOSFET.

Furthermore, the path of the displacement current generated below gate pad 59 can be shortened. This leads to small voltage drop in body region 12. Accordingly, an effect of protecting gate insulating film 21 is increased.

Furthermore, according to this embodiment, $p^+$ region 17a is provided not to overlap with gate electrode 30. Accordingly, leakage current of the MOSFET can be made smaller.

The thickness and film quality of gate insulating film 21 affect the threshold voltage of the MOSFET, for example. In order to attain the thickness and film quality of gate insulating film 21 as uniform as possible in the plane of the semiconductor chip or the plane of the semiconductor wafer, the gate insulating film is generally formed by a thermal oxidation method.

The thickness of the insulating film (i.e., thermal oxidation film) formed by the thermal oxidation method is dependent on the conductivity type and concentration of the impurity included in the underlying semiconductor layer. For example, when the thermal oxidation film is formed on the p type region under the same film formation condition, the oxidation rate is decreased as the impurity concentration of the p type region is higher, with the result that the thermal oxidation film is likely to become thin. Therefore, the thickness of gate insulating film 21 on $p^+$ region 17a is likely to be smaller than the thickness of gate insulating film 21 on body region 12. Furthermore, as the impurity concentration of the p type region is higher, the film quality of the thermal oxidation film is likely to be deteriorated due to a reason such as decrease in crystallinity (for example, increase of defects).

For such a reason, the dielectric breakdown voltage of gate insulating film 21 on $p^+$ region 17a is likely to be low. In the ON state of the MOSFET, the voltage applied to gate electrode 30 is higher than the voltage of the source by a voltage equal to or more than the threshold voltage of the MOSFET. If both gate insulating film 21 and gate electrode 30 are provided on $p^+$ region 17a, leakage current may take place between gate electrode 30 and $p^+$ regions 17a.

In this embodiment, when viewed in a plan view, gate electrode 30 is provided not to overlap with $p^+$ region 17a. Therefore, gate electrode 30 does not overlap with gate insulating film 21 on $p^{30}$ region 17a. This leads to a small leakage current while the MOSFET is on.

Furthermore, in this embodiment, gate electrode 30 is not provided below the central portion of gate pad 59. When gate electrode 30, gate insulating film 21, and body region 12 overlap with one another, a capacitor is formed. As the area of gate electrode 30 becomes larger, the capacitance value of this capacitor becomes larger. When the capacitance value of the capacitor becomes larger, a signal propagating in gate electrode 30 is more delayed. In this embodiment, the area of the portion of gate electrode 30 overlapping with gate pad 59 can be small. Accordingly, the capacitance value of the capacitor becomes small, thereby reducing delay time of the signal propagating in gate electrode 30.

Figure 7:
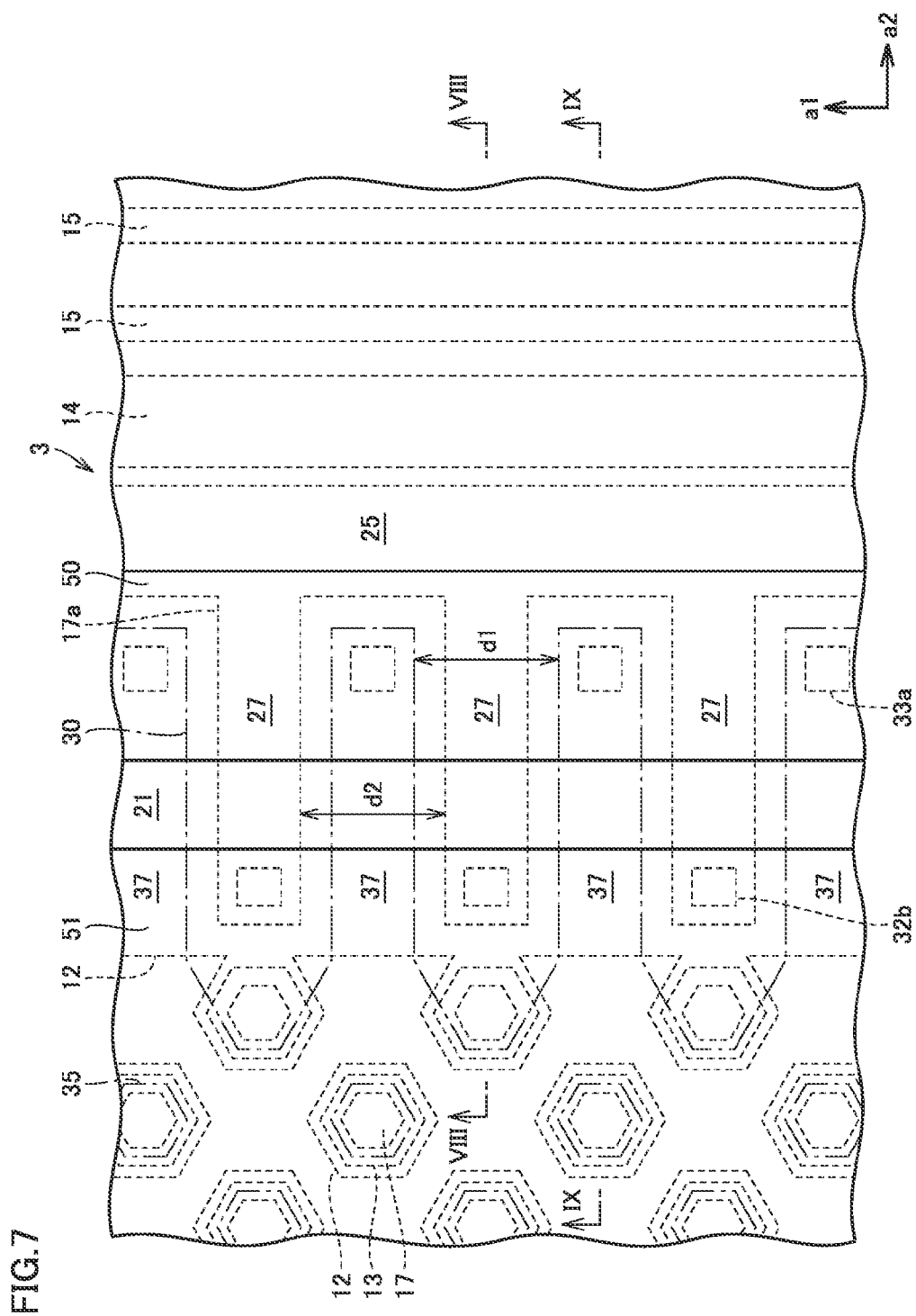
FIG. 7 is a partial enlarged view of a region 3 of silicon carbide semiconductor device 1 shown in FIG. 1.

According to this embodiment, $p^+$ region 17a is provided not only below gate pad 59 but also below gate runner 50. FIG. 7 is a partial enlarged view of region 3 of silicon carbide semiconductor device 1 shown in FIG. 1. With reference to FIG. 3 and FIG. 7, the structure of gate electrode 30 for connection to gate runner 50 is basically the same as that of gate electrode 30 for connection to the gate pad.

As shown in FIG. 7, gate electrode 30 includes a plurality of connection portions 37 in addition to element electrode portion 35. The plurality of connection portions 37 are electrode portions (second comb-tooth shaped electrode portions) provided in the form of comb teeth. As with the plurality of connection portions 36, the plurality of connection portions 37 are arranged side by side in direction a1 with predetermined space d1 interposed therebetween. Furthermore, each of the plurality of connection portions 37 extends from element electrode portion 35 in direction a2. Direction a2 is a direction extending from a side inwardly of gate runner 50 toward gate runner 50.

When viewed in a plan view, contact holes 33a are provided to overlap with gate runner 50 and the plurality of connection portions 37 of gate electrode 30. Accordingly, the plurality of connection portions 37 of gate electrode 30 are connected to gate runner 50.

$P^+$ region 17a has peripheral portions 27 provided to face the second comb-tooth shaped electrode portions (the plurality of connection portions 37) of gate electrode 30 with a space interposed therebetween. The plurality of peripheral portions 27 are arranged side by side in direction a1 with predetermined space d2 interposed therebetween. Furthermore, the plurality of peripheral portions 27 extend in a direction opposite to direction a2. In the configuration shown in FIG. 7, the direction opposite to direction a2 is a direction extending toward inside gate runner 50.

When viewed in a plan view, contact holes 32b overlap with peripheral portions 27 of p$^+$ region 17a and source pad 51. Therefore, peripheral portions 27 of p$^+$ region 17a are electrically connected to source pad 51. As with peripheral portions 26, peripheral portions 27 of p$^+$ region 17a are electrically connected to source pad 51 at the circumferential edge portion of source pad 51.

Figure 8:
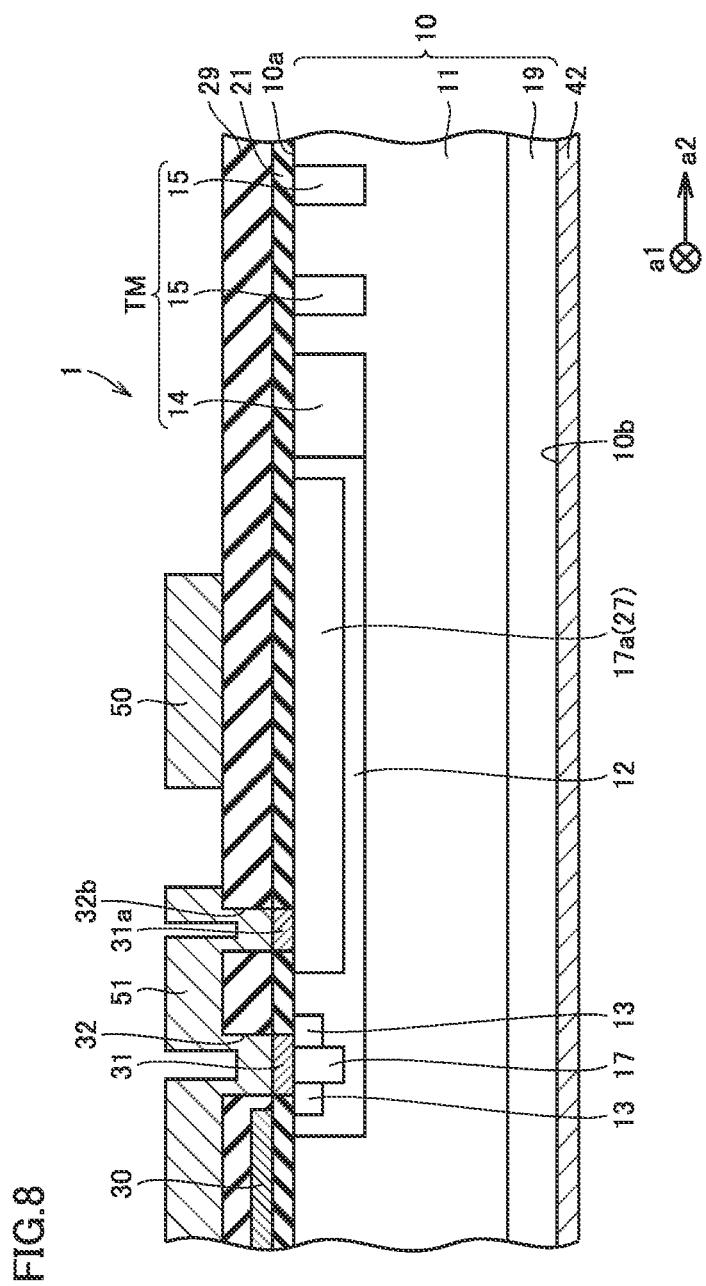
FIG. 8 is a partial cross sectional view of silicon carbide semiconductor device 1 along a VIII-VIII line of FIG. 7.
Figure 9:
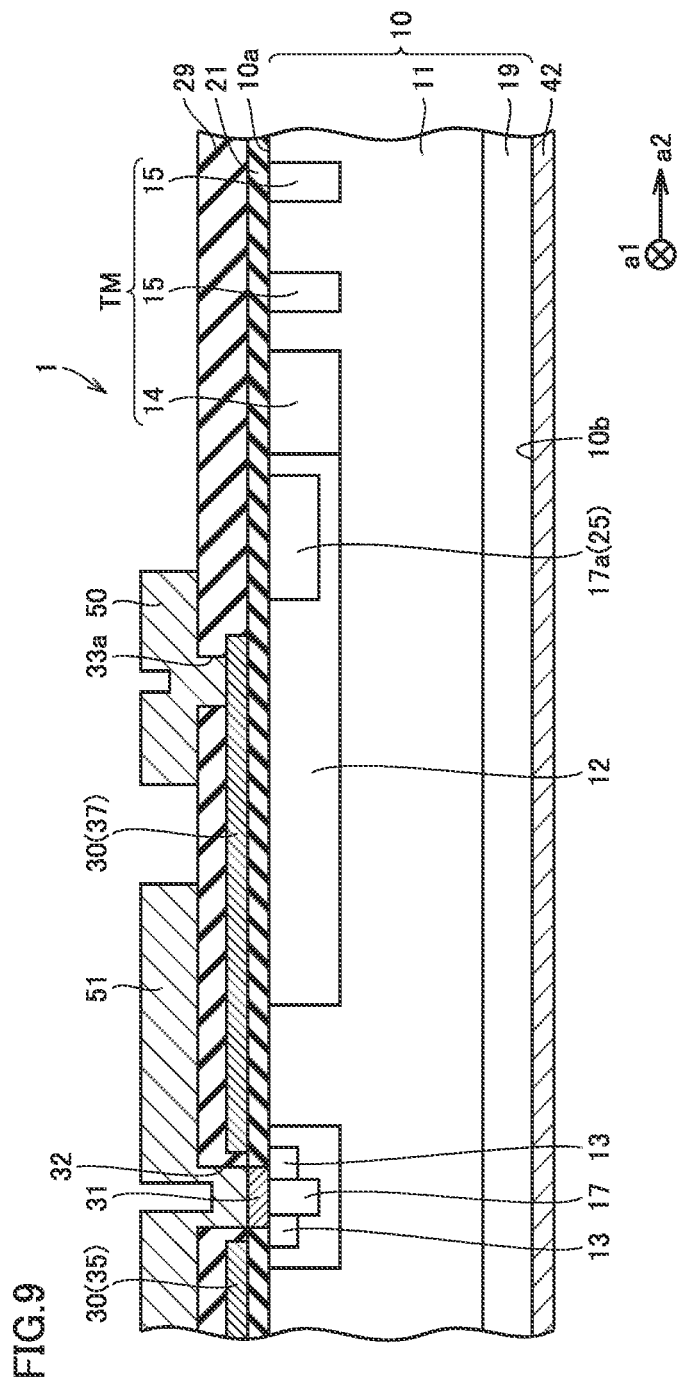
FIG. 9 is a partial cross sectional view of silicon carbide semiconductor device 1 along a IX-IX line of FIG. 7.

FIG. 8 is a partial cross sectional view of silicon carbide semiconductor device 1 along a VIII-VIII line of FIG. 7. FIG. 9 is a partial cross sectional view of silicon carbide semiconductor device 1 along a IX-IX line of FIG. 7.

With reference to FIG. 7 to FIG. 9, termination region TM is provided outwardly of body region 12. Termination region TM includes a JTE (Junction Termination Extension) region 14 and guard ring regions 15. Each of JTE region 14 and guard ring regions 15 has p type conductivity. The concentration of an impurity included in each of JTE region 14 and guard ring regions 15 is less than the impurity concentration of body region 12.

JTE region 14 is provided outwardly of body region 12, and is in contact with body region 12. Accordingly, JTE region 14 is electrically connected to body region 12. However, another p type region may be provided between JTE region 14 and body region 12, and JTE region 14 and body region 12 may be electrically connected to each other by that another p type region.

Guard ring regions 15 are provided outwardly of JTE region 14. Guard ring regions 15 are provided to be spaced away from JTE region 14. By guard ring regions 15, the breakdown voltage of silicon carbide semiconductor device 1 can be improved more.

In this embodiment, as an example, two guard ring regions 15 are shown. However, the number of guard ring regions 15 is not particularly limited. Furthermore, although not shown in the figures, termination region TM may have a field stop region having n type at the outer circumferential side of guard ring regions 15.

According to this embodiment, the upper ends of guard ring regions 15 are aligned with first main surface 10a of silicon carbide layer 10. However, guard ring regions 15 may be provided to be spaced away from first main surface 10a of silicon carbide layer 10. According to such a configuration, an n type region is provided between first main surface 10a of silicon carbide layer 10 and each of guard ring regions 15.

P$^{30}$ region 17a is provided not only below gate pad 59 but also below gate runner 50. Accordingly, holes can be injected from a wider range into the depletion layer expanding in body region 12. Therefore, the depletion layer expanding in body region 12 can be reduced more quickly. Hence, the switching speed of the silicon carbide semiconductor device can be increased.

According to the present embodiment, the switching speed of the MOSFET can be improved by designing a plane layout (mask pattern) for gate electrode 30 and p$^+$ region 17a. This suppresses increase in the number of manufacturing steps. Regarding this point, the following describes an exemplary method for manufacturing silicon carbide semiconductor device 1 according to the present embodiment. It should be noted that in order to facilitate understanding thereof, the structure shown in FIG. 9 is employed for the explanation of the manufacturing method below.

Figure 10:
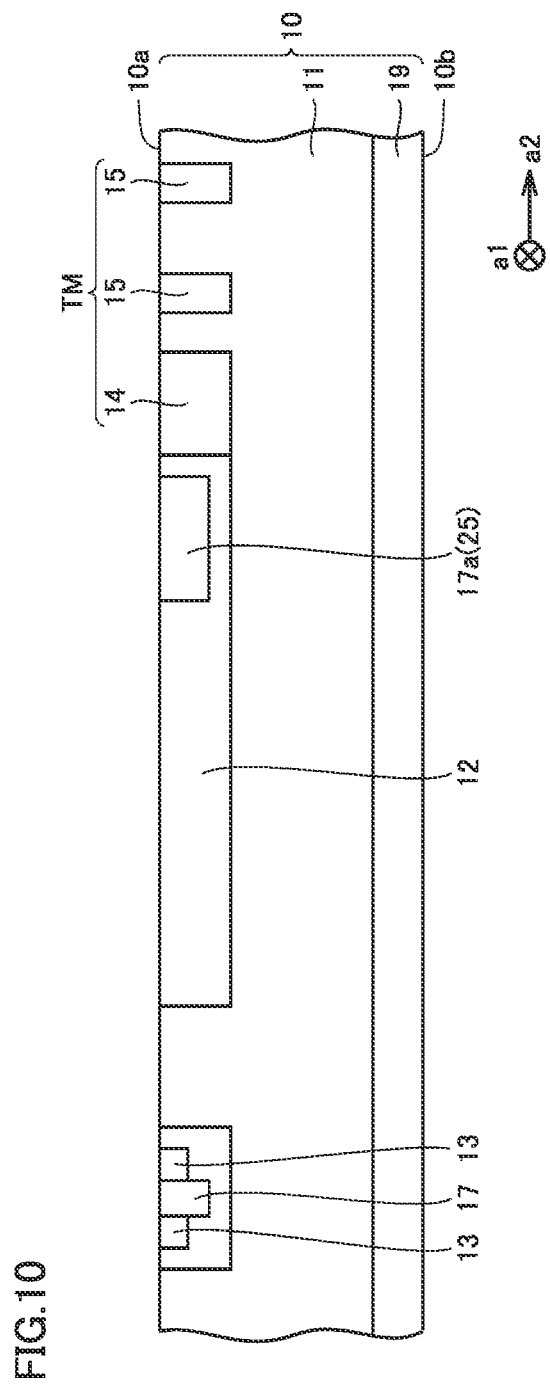
FIG. 10 is a partial cross sectional view schematically showing a first step of a method for manufacturing silicon carbide semiconductor device 1 according to the embodiment of the present invention.

FIG. 10 is a partial cross sectional view schematically showing a first step of the method for manufacturing silicon carbide semiconductor device 1 according to the embodiment of the present invention. With reference to FIG. 10, a single-crystal substrate 19 is prepared first. Next, drift region 11 is formed on single-crystal substrate 19 by epitaxial growth of silicon carbide. Accordingly, silicon carbide layer 10 having single-crystal substrate 19 and drift region 11 is formed.

The epitaxial growth can be performed by means of a CVD (Chemical Vapor Deposition) method. On this occasion, hydrogen gas can be used as a carrier gas. As a source material gas, a mixed gas of silane (SiH$_4$) and propane (C$_3$H$_8$) can be used, for example. In doing so, it is preferable to introduce nitrogen (N) or phosphorus (P) as an impurity for providing silicon carbide with n type conductivity, for example.

Next, body region 12, source region 13, JTE region 14, guard ring regions 15, and p$^+$ regions 17, 17a are formed through ion implantation of conductive impurities. Then, activation heat treatment is performed to activate the impurities. For example, heating is performed for 30 minutes at a temperature of approximately 1700° C. in an argon (Ar) atmosphere.

Figure 11:
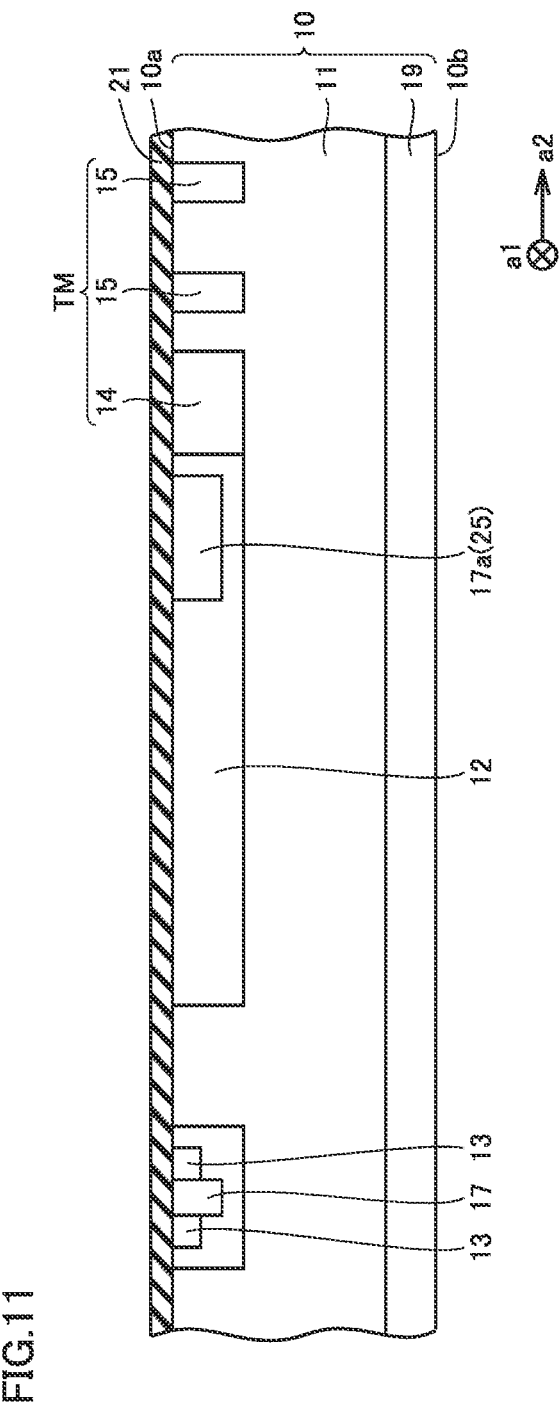
FIG. 11 is a partial cross sectional view schematically showing a second step of the method for manufacturing silicon carbide semiconductor device 1 according to the embodiment of the present invention.

FIG. 11 is a partial cross sectional view schematically showing a second step of the method for manufacturing silicon carbide semiconductor device 1 according to the embodiment of the present invention. With reference to FIG. 11, gate insulating film 21 is formed through thermal oxidation of first main surface 10a of silicon carbide layer 10. The thermal oxidation is performed by heating silicon carbide layer 10 for approximately 30 minutes at a temperature of approximately 1200° C. in air or oxygen, for example.

Next, nitrogen annealing is performed. Accordingly, the nitrogen concentration is adjusted such that the maximum value of the nitrogen concentration becomes not less than about $1+10^{21}$/cm$^3$ in a region within 10 nm from the interface between silicon carbide layer 10 and gate insulating film 21. For example, in an atmosphere of gas containing nitrogen, such as nitrogen monoxide gas, heating is performed at a temperature of approximately 1100° C. for approximately 120 minutes. After this nitrogen annealing treatment, an annealing treatment may be performed additionally in an inert gas atmosphere. For example, in an argon atmosphere, heating is performed at a temperature of approximately 1100° C. for approximately 60 minutes. Accordingly, high channel mobility can be attained with good reproducibility.

Figure 12:
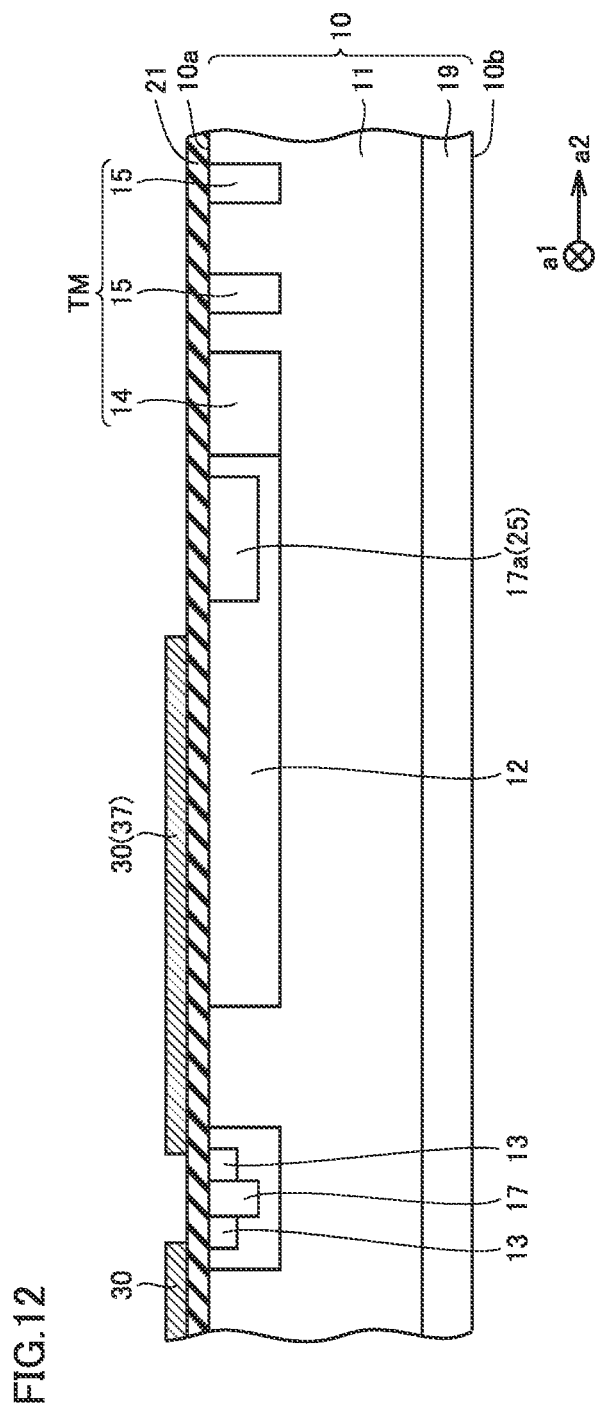
FIG. 12 is a partial cross sectional view schematically showing a third step of the method for manufacturing silicon carbide semiconductor device 1 according to the embodiment of the present invention.

FIG. 12 is a partial cross sectional view schematically showing a third step of the method for manufacturing silicon carbide semiconductor device 1 according to the embodiment of the present invention. With reference to FIG. 12, gate electrode 30 is formed on gate insulating film 21. More specifically, for example, doped polysilicon is deposited on gate insulating film 21 by way of the CVD method. Next, a patterning is performed using a photolithography method. Through etching, gate electrode 30 having a plane pattern shown in FIG. 3 and FIG. 7 is formed on gate insulating film 21.

As shown in FIG. 12, connection portions 36 of gate electrode 30 and peripheral portions 26 of p$^+$ region 17 are displaced from one another in terms of their positions in direction a2. Therefore, when viewed in a plan view, connection portions 36 of gate electrode 30 and peripheral portions 26 of p+ region 17 do not overlap with one another.

Figure 13:
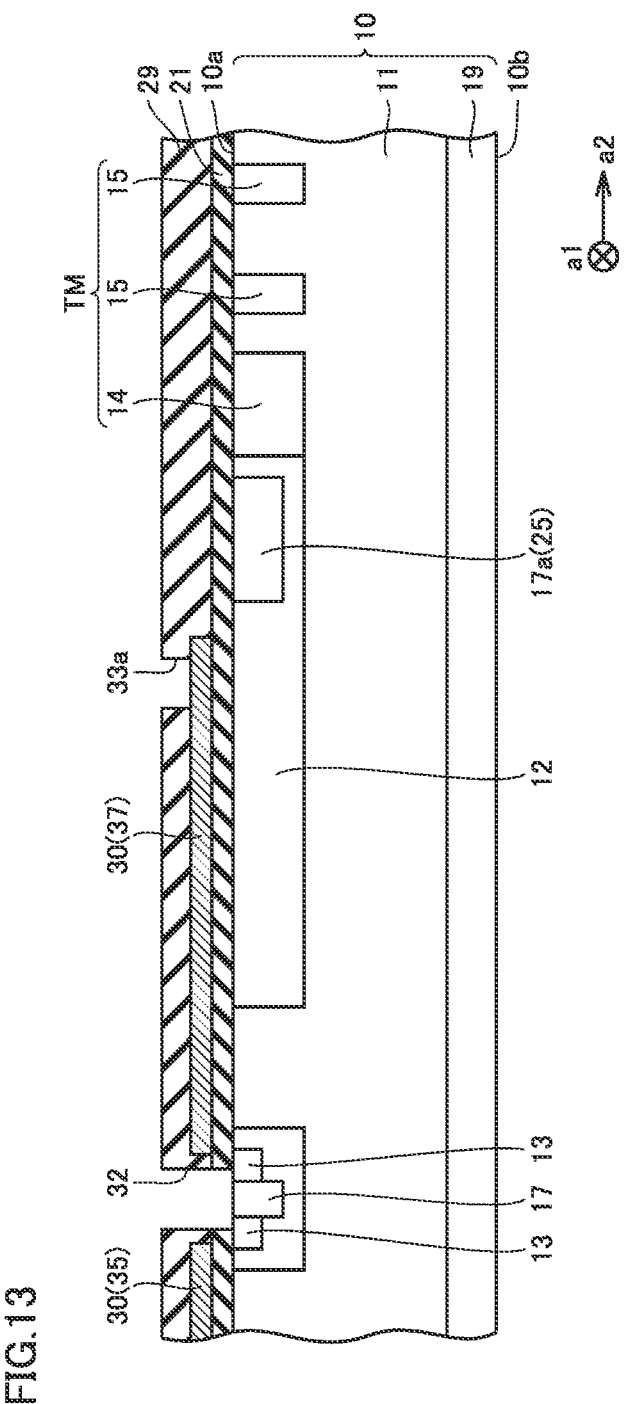
FIG. 13 is a partial cross sectional view schematically showing a fourth step of the method for manufacturing silicon carbide semiconductor device 1 according to the embodiment of the present invention.

FIG. 13 is a partial cross sectional view schematically showing a fourth step of the method for manufacturing silicon carbide semiconductor device 1 according to the embodiment of the present invention. With reference to FIG. 13, interlayer insulating film 29 is formed to cover gate insulating film 21 and gate electrode 30. Next, contact holes 32, 33 are formed in interlayer insulating film 29 and gate insulating film 21 by photolithography and etching.

Figure 14:
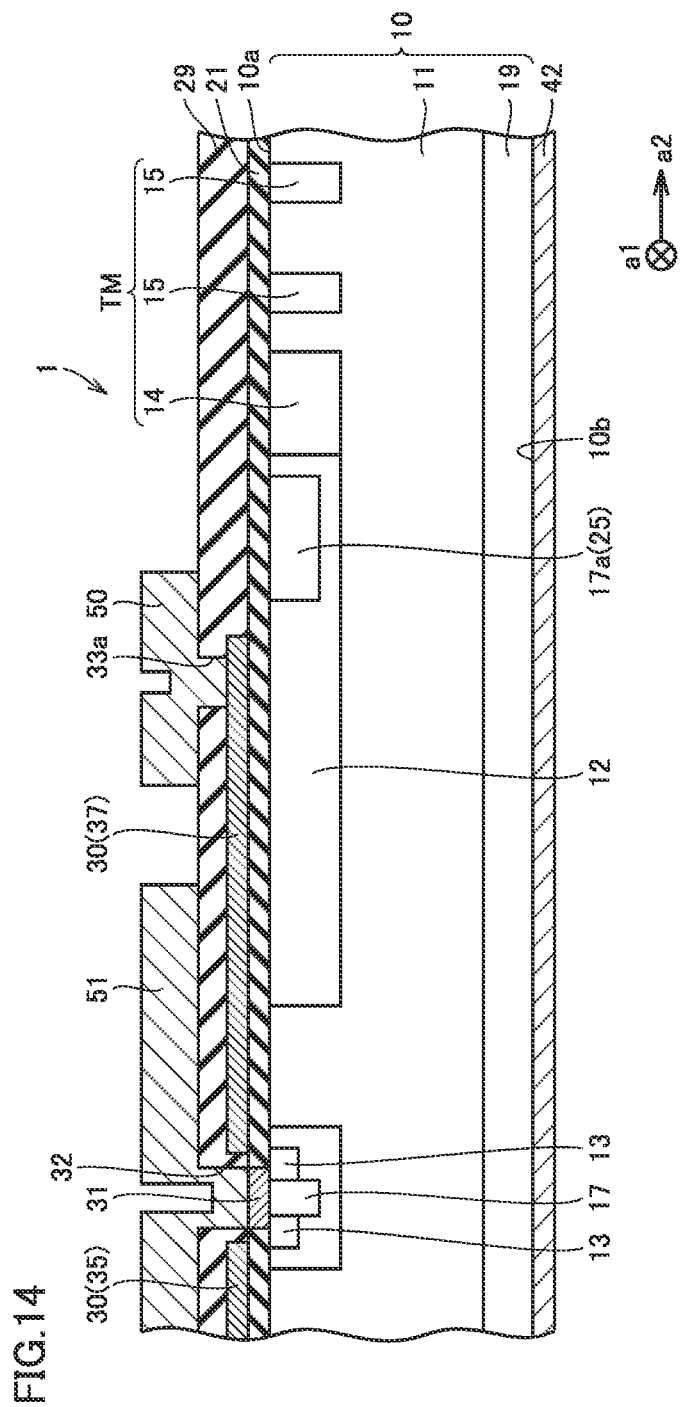
FIG. 14 is a partial cross sectional view schematically showing a fifth step of the method for manufacturing silicon carbide semiconductor device 1 according to the embodiment of the present invention.

FIG. 14 is a partial cross sectional view schematically showing a fifth step of the method for manufacturing silicon carbide semiconductor device 1 according to the embodiment of the present invention. With reference to FIG. 14, ohmic electrode 31 is formed in contact hole 32. Furthermore, drain electrode 42 is formed on the second main surface of silicon carbide layer 10.

Next, sputtering is employed to deposit, on interlayer insulating film 29, a conductive material including aluminum, for example. Through photolithography and etching, source pad 51, gate runner 50, and gate pad 59 (see the FIG. 4 and the like) are formed.

In order to prevent the problem of leakage resulting from gate insulating film 21 on p+ region 17a, it can be considered to remove gate insulating film 21 on p+ region 17a and then provide another insulating film on p+ region 17a. However, this increases the number of the manufacturing steps.

According to the above-mentioned manufacturing method, the step of removing gate insulating film 21 below gate pad 59 is not required. Therefore, according to the present embodiment, the number of the manufacturing steps can be prevented from being increased. By preventing the increase in the number of the manufacturing steps, there can be provided a silicon carbide semiconductor device allowing for increased switching speed with a simpler configuration.

In the configuration shown in FIG. 2, central portion 25 of p+ region 17a is a region having no gap therein. However, the planar shape of p+ region 17a is not limited as shown in FIG. 2.

Figure 15:
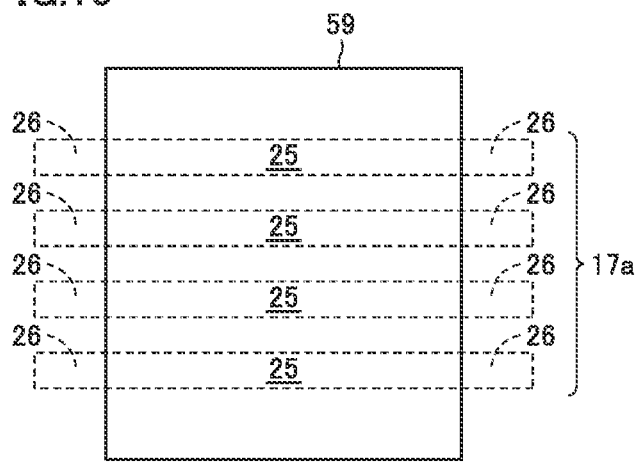
FIG. 15 shows another exemplary planar shape of a p$^+$ region 17a shown in FIG. 2.

FIG. 15 shows another exemplary planar shape of p+ region 17a shown in FIG. 2. With reference to FIG. 15, central portions 25 and peripheral portions 26 are formed in the form of strips. The plurality of strip regions are provided with spaces interposed therebetween. In other words, p+ region 17a is formed in the form of stripes.

Figure 16:
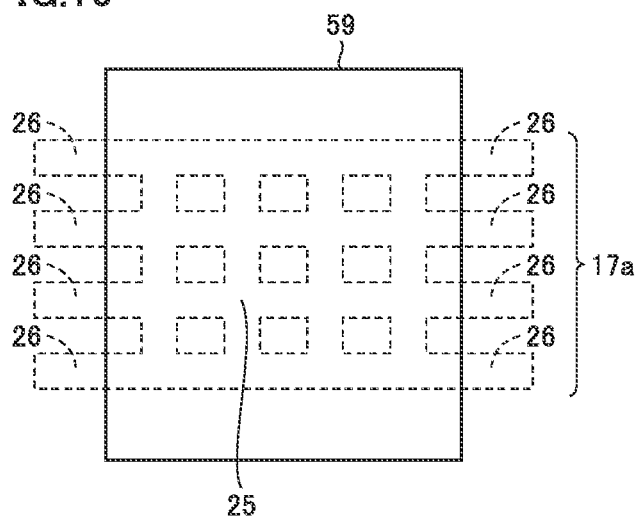
FIG. 16 shows still another exemplary planar shape of p$^+$ region 17a shown in FIG. 2.

FIG. 16 shows still another exemplary planar shape of p+ region 17a shown in FIG. 2. With reference to FIG. 16, central portion 25 is formed in the form of a grid.

Also in each of the configurations of FIG. 15 and FIG. 16, with central portion 25 of p+ region 17a, a region including a p type impurity at a high concentration can be formed below gate pad 59.

Furthermore, peripheral portions 26 extend from central portion 25 toward outside of gate pad 59. The plurality of peripheral portions 26 are provided with a space interposed therebetween. Accordingly, connection portions 36 (not shown) of gate electrode 30 and peripheral portions 26 of p+ region 17a are alternately arranged so as not to overlap with one another.

It should be noted that in the above-mentioned embodiment, the so-called planar gate type MOSFET has been illustrated. However, the present invention is applicable also to a trench gate type MOSFET.

It should be also noted that in the present embodiment, the MOSFET has been disclosed as the silicon carbide semiconductor device including the gate insulating film and the gate electrode. However, the silicon carbide semiconductor device including the gate insulating film and the gate electrode may be an IGBT (Insulated Gate Bipolar Transistor).

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: silicon carbide semiconductor device; 2, 3: region; 10: silicon carbide layer; 10a: first main surface; 10b: second main surface; 11: drift region; 12: body region; 13: source region; 14: JTE region; 15: guard ring region; 17, 17a: p+ region; 19: single-crystal substrate; 21: gate insulating film; 25: central portion; 26, 27: peripheral portion; 29: interlayer insulating film; 30: gate electrode; 31: ohmic electrode; 32, 32a,32b, 33, 33a: contact hole; 35: element electrode portion; 36, 37: connection portion;

42: drain electrode; 50: gate runner; 51: source pad; 59: gate pad; CL: element region; TM: termination region; a1, a2: direction; d1, d2: space.

The invention claimed is:

1. A silicon carbide semiconductor device comprising:
a silicon carbide layer having a first main surface and a second main surface opposite to the first main surface, the silicon carbide layer including
a first region having n type conductivity, the first region defining the first main surface of the silicon carbide layer,
a second region provided in the first region, the second region having p type conductivity, and
a third region provided in the second region, the third region having the p type conductivity and having an impurity concentration higher than an impurity concentration of the second region;
a gate insulating film provided on the second region of the silicon carbide layer;
a gate electrode provided on the gate insulating film;
an interlayer insulating film provided to cover the gate insulating film and the gate electrode, the interlayer insulating film being provided with a first contact hole to expose the gate electrode; and
a gate pad provided on the interlayer insulating film, the gate pad being electrically connected to the gate electrode through the first contact hole,
the gate electrode including a first comb-tooth shaped electrode portion extending from outside of the gate pad toward a circumferential edge portion of the gate pad and overlapping with the gate pad at the circumferential edge portion of the gate pad when viewed in a plan view,
the third region including
a central portion overlapping with the gate pad when viewed in the plan view, and
a first peripheral portion extending from the central portion toward the outside of the gate pad, the first peripheral portion being provided to face the first comb-tooth shaped electrode portion of the gate electrode with a space interposed therebetween.

2. The silicon carbide semiconductor device according to claim 1, further comprising a gate runner provided to overlap with the second region when viewed in the plan view, the gate runner surrounding the gate electrode and being electrically connected to the gate pad, wherein the gate electrode further includes a second comb-tooth shaped electrode portion extending from a side inwardly of the gate runner toward the gate runner and overlapping with the gate runner when viewed in the plan view, the interlayer insulating film is provided with a second contact hole for electrically connecting the second comb-tooth shaped electrode portion of the gate electrode to the gate runner, and the third region further includes a second peripheral portion extending toward an inner circumferential side of the gate runner, the second peripheral portion being provided to face the second comb-tooth shaped electrode portion of the gate electrode with a space interposed therebetween.

3. The silicon carbide semiconductor device according to claim 1, wherein the impurity concentration of the third region is not less than $5\times10^{18}$ cm$^{-3}$ and not more than $2\times10^{20}$ cm$^{-3}$.

4. The silicon carbide semiconductor device according to claim 1, wherein the gate insulating film is a thermal oxidation film.

5. The silicon carbide semiconductor device according to claim 1, further comprising:
- a fourth region provided in the second region, the fourth region having the n type conductivity;
- a fifth region provided in the second region, the fifth region having the p type conductivity;
- an ohmic electrode in ohmic junction with the third region; and
- a source pad electrically connected to the ohmic electrode, the fourth region, and the fifth region.

* * * * *